United States Patent [19]

Vig et al.

[11] Patent Number: 4,554,717
[45] Date of Patent: Nov. 26, 1985

[54] METHOD OF MAKING MINIATURE HIGH FREQUENCY SC-CUT QUARTZ CRYSTAL RESONATORS

[75] Inventors: John R. Vig, Colts Neck; Arthur Ballato, Long Branch, both of N.J.

[73] Assignee: The United States of America as represented by the Secretary of the Army, Washington, D.C.

[21] Appl. No.: 559,546

[22] Filed: Dec. 8, 1983

[51] Int. Cl.$^4$ ............................................. H04R 17/00
[52] U.S. Cl. .................................... 29/25.35; 156/636; 156/645
[58] Field of Search ............... 29/25.35; 310/320, 321, 310/346, 324, 368, 360, 342; 340/140 R; 51/310, 311, 312, 317, 318, DIG. 34; 156/733, 272.8, 663, 636, 645

[56] References Cited

U.S. PATENT DOCUMENTS

| | | | |
|---|---|---|---|
| 3,201,905 | 8/1965 | Snyder | 51/DIG. 34 X |
| 3,694,677 | 9/1972 | Guttwein et al. | 310/346 X |
| 3,872,411 | 3/1975 | Wanatabe et al. | 29/25.35 X |
| 4,224,547 | 9/1980 | Miller | 29/25.35 X |
| 4,274,907 | 6/1981 | Vig et al. | 156/663 X |
| 4,393,131 | 7/1983 | Whalin et al. | 29/25.35 X |
| 4,472,652 | 9/1984 | Brice et al. | 29/25.35 X |
| 4,475,981 | 10/1984 | Rea | 156/645 X |

OTHER PUBLICATIONS

Ecom; "Chemically Polished Quartz"; 6-1-77; Vig. LeBus, & Filler; Electronics Technology & Devices Laboratory.

Primary Examiner—Mark Rosenbaum
Assistant Examiner—John T. Burtch
Attorney, Agent, or Firm—Anthony T. Lane; Jeremiah G. Murray; Roy E. Gordon

[57] ABSTRACT

Miniature high frequency SC-cut quartz crystal resonators are made from a plano-plano SC-cut quartz crystal wafer by chemically polishing the wafer; then chemomechanically polishing the chemically polished wafer; then chemically polishing the chemomechanically polished wafer; depositing a suitable pattern of etch resist on the wafer using standard photolithographic techniques; chemically polishing the wafer; stripping the photoresist from the wafer; placing a suitable evaporative mask pattern into intimate contact with the wafer; depositing a suitable pattern of electrodes on the wafer; testing the resonators so formed on the wafer; selectively separating those resonators having the desired properties; mounting the selected resonators into an enclosure; adjusting the frequency of the selected resonators to the exact frequency desired; and hermetically sealing the enclosure.

4 Claims, 1 Drawing Figure

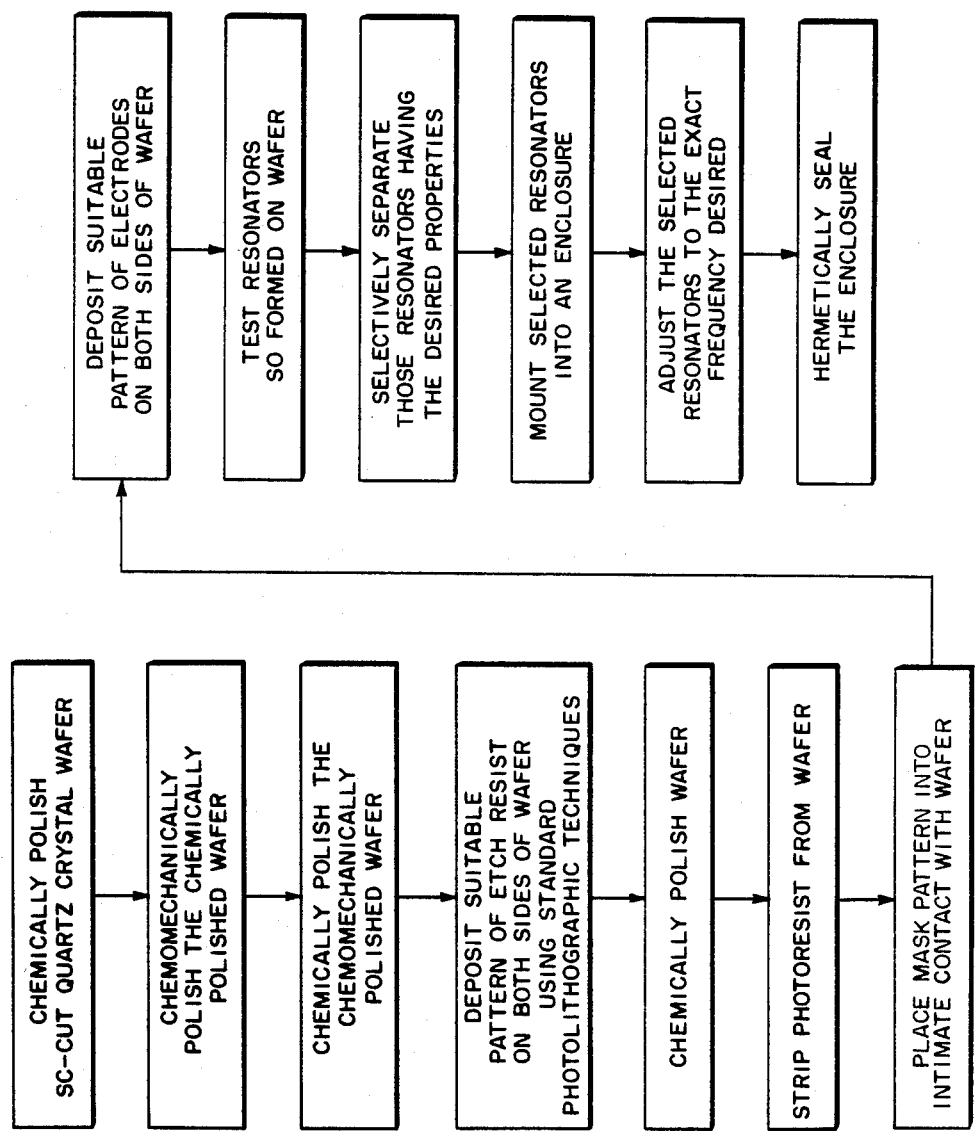

METHOD OF MAKING MINIATURE HIGH FREQUENCY SC-CUT QUARTZ CRYSTAL RESONATORS

The invention described herein may be manufactured, used, and licensed by or for the Government for govermental purposes without the payment to us of any royalty thereon.

This invention relates in general to a method of making resonators and in particular to a method of making miniature high frequency SC-cut quartz crystal resonators.

BACKGROUND OF THE INVENTION

A method of making high frequency quartz plates is disclosed in U.S. Pat. No. 4,274,907 issued June 23, 1981 to Vig et al. The method disclosed involves lapping the quartz plate with a fine abrasive, then etching the quartz plate with a chemical polishing etching solution, then polishing the quartz plate with a chemomechanical polishing process that produces a polished and undamaged surface, then etching the quartz plate with a chemical polishing etching solution. Such a method can produce very high frequency quartz plates, that is, fundamental mode frequencies in excess of 100 MHz. However, SC-cut plates that are greater than 100 MHz in frequency are less than 18 $\mu$m in thickness. Such thin plates are very difficult to make into conventional resonators by conventional techniques. The primary reasons for the difficulty are the effects of mounting stresses, bonding stresses, and the difficulty of adjusting the frequency. Another method of making high frequency quartz plate is described in U.S. Pat. No. 3,694,677 issued Sept. 26, 1972 to Guttwein et al. In the Guttwein et al method, the thickness of a portion of the center of a conventional crystal plate is reduced by, for example, ion etching. The crystal plate is then mounted and sealed by conventional techniques. The typical embodiment of this invention is a circular plate of 8 mm diameter, the thickness of the center 5 mm diameter portion of which is reduced from 55.3 microns to 16.6 microns.

The Guttwein et al method has successfully produced high frequency resonators. The drawback of the Guttwein et al method is that, when it is implemented via ion etching, the process is very slow and the resulting resonators are prohibitive in cost. For example, an oscillator made with an ion-etched high frequency resonator costs about $8,000. Until recently, the method could not be properly implemented via chemical etching. That is, the quality of the etched surface might have reflected the preferential erosion by the etchant due to impurities or strains in the crystal lattice, or due to the inherent anisotropy of quartz. Moreover, the resultant surface might also have etch pits and etch channels that degrade the resonator Q and produce detrimental nonlinearities. Recently, some limited success has been achieved via the combination of the Guttwein et al method and the Vig et al chemical polishing etching method. The limitations of the use of the combined methods are due primarily to the etch channels and etch pits that are produced by the chemical polishing etching method. These channels and pits are due to defects that are present in all currently available quartz materials. The etch channel density of typical commercial quartz is on the order of 10 or 100 per $cm^2$ for swept quartz, and is signficantly higher for unswept quartz. Therefore, since a conventional resonator plate's diameter ranges from 5 mm to 15 mm, the yield for making conventional resonator plates that are free of etch channels is extremely low, even when the much more expensive swept quartz is used. The etch pits and etch channels degrade the Q of the resonators. A large number of etch pits and etch channels will degrade the Q of the resonator to an extent that makes the resonator unusable. Even a small number of etch pits and etch channels degrades the resonator Q, and produces various nonlinear effects which significantly limit the usefulness of the resonator.

SUMMARY OF THE INVENTION

The general object of this invention is to provide a method of making high frequency SC-cut quartz crystal resonators that are free of etch channels and etch pits. A further object of the invention is to provide such a method wherein the resulting resonators will be much smaller in size than those produced by previous methods. A still further object of the invention is to provide such a method that will be economic and wherein the resonator will be much lower in cost than those resonators produced by previous methods. Additional objects of the invention are to produce high frequency resonators that exhibit high Q and that are free of process and material defect induced nonlinearities.

It has now been found that the aforementioned objects can be attained and a large number of miniature high frequency SC-cut quartz crystal resonators obtained using chemical polishing techniques in combination with photolithographic techniques. More particularly, according to this invention, an SC-cut quartz crystal wafer is chemically polished, the chemically polished wafer then chemomechanically polished, the chemomechanically polished wafer again chemically polished, a suitable pattern of etch resist then deposited on the wafer using standard photolithographic techniques, the wafer chemically polished again, the photoresist stripped from the wafer, a suitable evaporation mask pattern placed into intimate contact with the wafer, a suitable pattern of electrodes then deposited on the wafer, the resonators so formed on the wafer tested, those resonators having the desired properties selectively separated, the selected resonators mounted into an enclosure, the frequency of the selected resonators adjusted to the exact frequency desired, and the enclosure hermetically sealed.

In this connection, it should be pointed out that a conventional above-100 MHz fundamental mode SC-cut resonator plate would need to be less than 1.4 in diameter in order for the diameter to thickness ratio to be about 80, which is sufficient for achieving good Q. Since a 1.4 mm diameter crystal plate is very difficult to handle, conventional resonators are generally at least 5 mm in diameter, that is, the potentially smaller diameter that the above 100 MHz frequency would permit cannot be realized when using conventional manufacturing methods.

The small size can, however, be realized by the method of the instant invention wherein one uses chemical polishing etching techniques in combination with photolithographic techniques. The photolithographic techniques have been described by J. H. Staudte on pp. 50 to 54 of the Proc. of the 27th Annual Symposium on Frequency Control (1973) and by R. Ward in the Proc. of the 4th Quartz Crystal Conference, 1982. By combining the chemical polishing etching method of Vig et al, the inverted mesa type structure of Guttwein et al, and the photolithographic technique, one can mass produce miniature high frequency crystal resonators at orders-of-magnitude lower cost than competitive techniques. Another advantage of the method is that since the resonator plate area is very small, there is a lower probability for an etch channel or pit to be present and degrade the resonators' performance.

The frequencies of the resonators can be adjusted by laser trimming, or by anodic oxidation of aluminum electrodes. The electrodes can also be on two separate pieces of quartz that have the same crystallographic orientation and are in close proximity to the thinned region of the resonator and that are cemented to the outer rims of the resonator. The resonators can be mounted at one end only, or, by leaving a thicker portion at the other end also, at two points. Various stress relief mechanisms can be readily incorporated through the use of the photolithographic/etching techniques.

DESCRIPTION OF THE DRAWING

The drawing is a flow sheet of the steps of the invention.

DESCRIPTION OF THE PREFERRED EMBODIMENT

A plano-plano SC-cut quartz crystal wafer 25 mm×25 mm in area, 100 μm in thickness and having a surface finish of 1 μm is chemically polished with a 4:1 solution of $NH_4F/HF$ to a thickness of 75 μm. The chemically polished wafer is then chemomechanically polished with a colloidal silica polishing compound and flat polyurethane polishing pads to a thickness of 70 μm. The wafer is then chemically polished to a thickness of 68 μm. A suitable pattern in the form of a square grid of square apertures in which each aperture of the grid measures about 1.4 mm on a side and in which each aperture of the grid is spaced from adjacent apertures of the grid by a distance about 2.8 mm is deposited on both sides of the wafer using standard double sided photolithographic techniques. The wafer is immersed in the chemical polishing solution to chemically polish the exposed aperture portions of the quartz to a thickness of about 18 μm, thereby forming an array of inverted mesa resonators. The photoresist is then stripped from both sides of the wafer. A suitable evaporation mask in the form of a square grid with keyhole shaped apertures is then placed in intimate contact with the wafer. The centers of the circular portions of the keyhole patterns are registered to be in the center of the etched inverted mesas. The corresponding tab portions of the keyhole pattern on the tabs and bottom of the wafer are directed to be 180° apart, so that the top and bottom circular portions of the keyhole pattern represent the only regions of overlap on each aperture. Each of the circular overlapping portions of the keyhole pattern are of 0.58 mm in diameter. The tab widths in each case are about 0.5 mm. An aluminum film of about 500 angstroms in thickness is deposited on both sides of the inverted mesas. The individual resonators are tested for properties such as quality factor, motional capacitance, resonance frequency, and frequency-temperature behavior, etc. Those resonators having the desired properties are selectively separated and mounted into an enclosure. The frequencies of the resulting miniature SC-cut quartz crystal resonators of about 100 MHz fundamental frequency are adjusted to the exact frequency desired by laser trimming either prior to or subsequent to hermetically sealing the resonator.

We wish it to be understood that we do not desire to be limited to the exact details as described for obvious modifications will occur to a person skilled in the art.

What is claimed is:

1. Method of making miniature high frequency SC-cut quartz crystal resonators that are free of etch channels and etch pits and that exhibit high Q and that are free of process and material defect induced nonlinearities from a plano-plano SC-cut quartz crystal wafer, said method including in the following order the steps of:
    (A) chemically polishing the wafer
    (B) chemomechanically polishing the chemically polished wafer
    (C) chemically polishing the chemomechanically polished wafer
    (D) depositing a suitable pattern of an etch resist of the wafer using standard photolithographic techniques
    (E) chemically polishing the wafer
    (F) stripping the photoresist from the wafer
    (G) placing a suitable evaporation mask pattern into intimate contact with the wafer
    (H) depositing metallic film electrodes onto the wafer
    (I) testing the resonators so formed on the wafer
    (J) selectively separating those resonators having the desired properties,
    (K) mounting the selected resonators into an enclosure,
    (L) adjusting the frequencies of the resonators, and
    (M) hermetically sealing the enclosure.

2. Method according to claim 1 wherein the frequencies of the resonators are adjusted after hermetically sealing the enclosure.

3. Method according to claim 1 wherein the wafer is chemically polished in a 4:1 solution of $NH_4F/HF$.

4. Method of making miniature high frequency SC-cut quartz crystal resonators that are free of etch channels and etch pits and that exhibit high Q and that are free of process and material defect induced nonlinearities from a plano-plano SC-cut quartz crystal wafer 25 mm×25 mm in area, 100 μm in thickness and having a surface finish of 1 μm, said method including the steps of:
    (A) chemically polishing the wafer with a 4:1 solution of $NH_4F/HF$ to a thickness of about 75 μm
    (B) chemomechanically polishing the chemically polished wafer with a colloidal silica polishing compound and flat polyurethane polishing pads to a thickness of about 70 μm
    (C) chemically polishing the wafer to a thickness of about 68 μm
    (D) depositing a pattern in the form of a square grid of square apertures in which each aperture of the grid measures about 1.4 mm on a side and in which each aperture of the grid is spaced from adjacent apertures of the grid by a distance about 2.8 mm on both sides of the wafer using standard double sided photolithographic techniques
    (E) immersing the wafer in the chemical polishing solution to chemically polish the exposed aperture portions of the quartz to a thickness of about 18 μm thereby forming an array of inverted mesa resonators
    (F) stripping the photoresist from both sides of the wafer
    (G) placing a suitable evaporation mask in the form of a square grid with keyhole shaped apertures in intimate contact with the wafer, the centers of the circular portions of the keyhole patterns being registered to be in the center of the etched inverted mesas, the corresponding tab portions of the keyhole pattern on the tabs and bottom of the wafer being directed to be 180° apart so that the top and bottom circular portions of the keyhole pattern represent the only regions of overlap of each aperture, each of the circular overlapping portions of the keyhole pattern being of about 0.58 mm in diameter, and the tab widths in each case being about 0.5 mm (H) depositing an aluminum film of about 500 angstroms in thickness on both sides of the inverted mesas
(I) testing the resonators so formed on the wafer
(J) selectively separating those resonators having the desired properties
(K) mounting the selected resonators into an enclosure
(L) adjusting the frequency of the selected resonators to the exact frequency desired by laser trimming, and
(M) hermetically sealing the enclosure.

* * * * *